US006596588B2

(12) United States Patent
Chou

(10) Patent No.: US 6,596,588 B2
(45) Date of Patent: Jul. 22, 2003

(54) METHOD OF FABRICATING A FLASH MEMORY CELL

(75) Inventor: Kuo-Yu Chou, Hsin-Chu Hsien (TW)

(73) Assignee: AMIC Technology Corporation, Hsin-Chu (TW)

( * ) Notice: Subject to any disclaimer, the term of this patent is extended or adjusted under 35 U.S.C. 154(b) by 121 days.

(21) Appl. No.: 09/682,813

(22) Filed: Oct. 22, 2001

(65) Prior Publication Data

US 2002/0177269 A1 Nov. 28, 2002

(30) Foreign Application Priority Data

May 25, 2001 (TW) .................................. 90112703 A

(51) Int. Cl.[7] .......................................... H01L 21/336
(52) U.S. Cl. ...................................... 438/259; 438/589
(58) Field of Search ................................ 438/259, 589, 438/FOR 193, FOR 197, FOR 189, FOR 203, FOR 212

(56) References Cited

U.S. PATENT DOCUMENTS

| 5,591,652 A | * | 1/1997 | Matsushita | 438/259 |
| 5,780,341 A | * | 7/1998 | Ogura | 438/259 |
| 6,051,465 A | * | 4/2000 | Kato et al. | 438/258 |
| 6,051,860 A | * | 4/2000 | Odanaka et al. | 257/316 |
| 6,157,058 A | * | 12/2000 | Ogura | 257/315 |
| 6,184,086 B1 | * | 2/2001 | Kao | 438/259 |
| 6,372,564 B1 | * | 4/2002 | Lee | 438/192 |

FOREIGN PATENT DOCUMENTS

TW            448576            8/2001

OTHER PUBLICATIONS

IBM Techical Disclosure Bulletin NN80055296 May 1, 1980 vol. 22, Issue 12, pp. 5296–5297.*

* cited by examiner

Primary Examiner—George Fourson
(74) Attorney, Agent, or Firm—Winston Hsu

(57) ABSTRACT

A semiconductor substrate has a V-shape structure positioned in the semiconductor substrate. A first ion implantation process is then performed to form a first doping region around the V-shape structure in the semiconductor substrate. Following this, a first dielectric layer is formed on surfaces of the semiconductor substrate and the first doping region. A floating gate is formed on the first dielectric layer over the first doping region and a second dielectric layer is formed on the floating gate, respectively. A controlling gate is then formed on the second dielectric layer. Finally, a second ion implantation process is performed utilizing the controlling gate as a mask to form a second doping region in the semiconductor substrate.

17 Claims, 5 Drawing Sheets

METHOD OF FABRICATING A FLASH MEMORY CELL

BACKGROUND OF INVENTION

1. Field of the Invention

The present invention relates to a method of fabricating a split-gate flash memory cell, and more particularly, to a method of fabricating a split-gate flash memory cell utilizing point discharge to reduce an erasing voltage.

2. Description of the Prior Art

Depending on the structure of gate, flash memory can be divided into a stacked-gate flash memory or a split-gate flash memory. The stacked-gate flash memory cell comprises a floating gate, a dielectric layer with an oxide/nitride/oxide (ONO) structure, and a controlling gate stacked respectively on a tunneling oxide layer. Wherein, all the vertical sides of the floating gate, the ONO dielectric layer and the controlling gate of the stacked-gate flash memory cell are approximately aligned. Although the stacked-gate flash memory cell occupies less area, an over-erasing problem sometimes occurs. Therefore, the split-gate flash memory cell is currently used to eliminate the over-erasing problem.

Please refer to FIG. 1 to FIG. 4 of schematic diagrams of a prior art method of fabricating a split-gate flash memory cell on a semiconductor wafer 10. As shown in FIG. 1, the semiconductor wafer 10 includes a silicon substrate 12 and a tunneling oxide layer 14 positioned on the silicon substrate 12.

As shown in FIG. 2, a photoresist layer 16 is formed on the surface of the tunneling oxide layer 14 followed by performing a photolithographic process to form a plurality of openings in the photoresist layer 16. The openings define positions for forming doping regions. Subsequently, using the photoresist layer 16 as a hard mask, an ion implantation process is performed to form two doping regions 22 in the silicon substrate 12. The photoresist layer 16 is then stripped and a rapid thermal processing (RTP) is utilized to activate the dopants in the doping regions 22. Therein, one of the two doping regions 22 is a source of the split-gate flash memory cell, and the other is a drain of the split-gate flash memory cell. Furthermore, a region of the silicon substrate 12 between the two doping regions 22 is defined as a channel region 20 of the split-gate flash memory cell.

As shown in FIG. 3, a low-pressure chemical vapor deposition (LPCVD) process is performed to form a polysilicon layer (not shown) on the surface of the tunneling oxide layer 14. A photoresist layer 26 is then coated on the polysilicon layer followed by utilizing a photolithographic process to form patterns for forming a floating gate in the photoresist layer 26. Subsequently, using the patterned photoresist layer 26 as a mask, an anisotropic etching process is performed to remove portions of the polysilicon layer down to the surface of the tunneling oxide layer 14, forming a floating gate 24 of the split-gate flash memory cell.

After the photoresist layer 26 is stripped, referring to FIG. 4, a thermal oxidation is used to form an ONO dielectric layer 28, consisting of a oxide layer, a silicon nitride layer and a silicon oxide layer, on the floating gate 24. Following this, an LPCVD is performed to form a polysilicon layer (not shown) on the semiconductor wafer 10. Another photoresist layer (not shown) is then coated on the polysillicon layer followed by performing photolithographic and etching processes to define patterns for forming a controlling gate and to remove a portion of the polysilicon layer, thereby forming a controlling gate 30 of the split-gate flash memory cell.

While performing a programming operation of the flash memory cell, effects of channel hot electrons (CHE) are most often utilized at the present time. In this case, the controlling gate 30 is supplied with a high voltage, the source is grounded, and the drain is supplied with a constant voltage. As a result, channel hot electrons occur to penetrate through the tunneling oxide layer 14 and inject to the floating gate 24, so as to achieve data storage. While performing erasing of the flash memory cell, a Fowler Nordheim tunneling technique is utilized. The controlling gate 30 is grounded or negative biased, and the drain is in a high-voltage state. As a result, the electrons storing in the floating gate 24 are removed.

An electric field of the tunneling oxide layer 14 must be at least 10 million volts per centimeter (MV/cm) while using the Fowler Nordheim tunneling technique to perform erasing operation. In order to prevent a high voltage from destructing the elements, the thickness of the tunneling oxide layer 14 is decreased to between 80 and 120 angstroms (Å) to achieve the high electric field. However, with the decreasing of the tunneling oxide layer 14, the flash memory cell may have two serious problems:

(1). Since the tunneling oxide layer 14 is not thick enough to provide the electrons stored in the floating gate 24 with an effective potential barrier, the ability of data retention of the flash memory cell is affected.

(2). A capacitance between the floating gate 24 and the silicon substrate 12 is increased with the decrease of the thickness of the tunneling oxide layer 14. Since a coupling ratio of the flash memory cell is reduced with the increasing of the capacitance between the floating gate 24 and the silicon substrate 12, the operation voltage of the flash memory cell still cannot be lowered.

SUMMARY OF INVENTION

It is therefore a primary objective of the present invention to provide a method to increase a thickness of a tunneling oxide layer and improve qualities of a split-gate flash memory cell.

It is another objective of the present invention to provide a method of fabricating a split-gate flash memory cell to lower an erasing voltage.

According to the claimed invention, a V-shape structure is formed in a semiconductor substrate. A first ion implantation process is then performed to form a first doping region around the V-shape structure in the semiconductor substrate. Following this, a first dielectric layer is formed on surfaces of the semiconductor substrate and the first doping region. A floating gate is formed on the first dielectric layer over the first doping region and a second dielectric layer is formed on the floating gate, respectively. A controlling gate is then formed on the second dielectric layer. Finally, a second ion implantation process is performed utilizing the controlling gate as a mask to form a second doping region in the semiconductor substrate.

It is an advantage of the present invention that the V-shape structure is positioned under the floating gate. While using the Fowler Nordheim tunneling technique to erase, point discharge is utilized through the V-shape structure to facilitate removal of the electrons storing in the floating gate. Thus, the erasing voltage of the flash memory cell can be effectively lowered according to the present invention. Additionally, the problems resulting from supplying a high voltage on the controlling gate, as in the prior art, are completely prevented.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
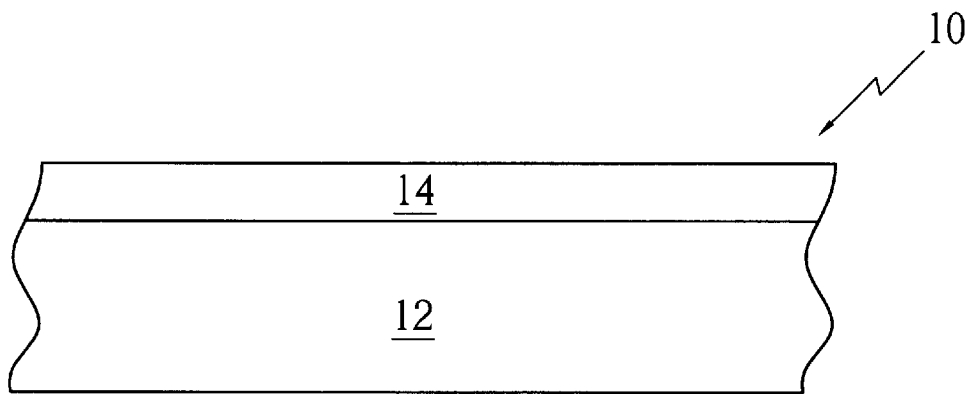
FIG. 1 to FIG. 4 are schematic diagrams of a prior art method of fabricating a split-gate flash memory cell.
Figure 2:
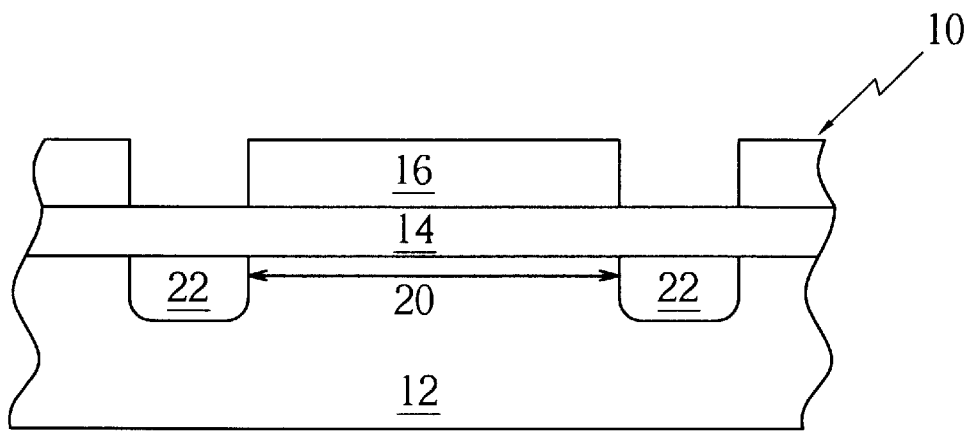
Figure 3:
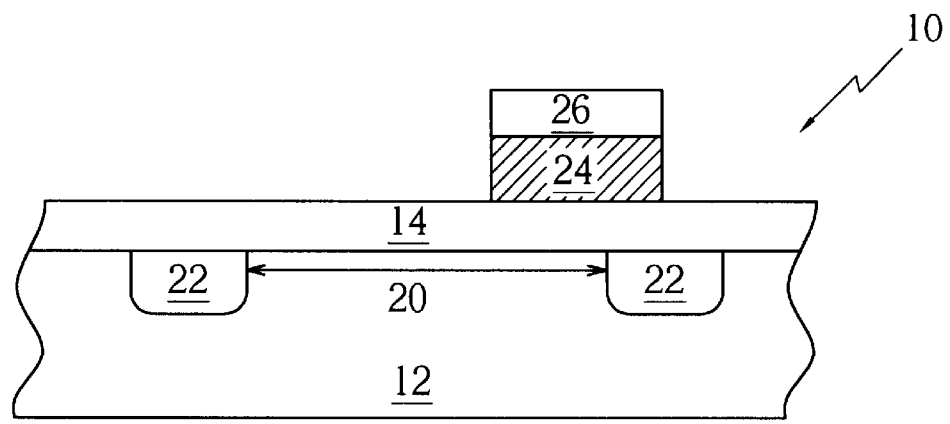
Figure 4:
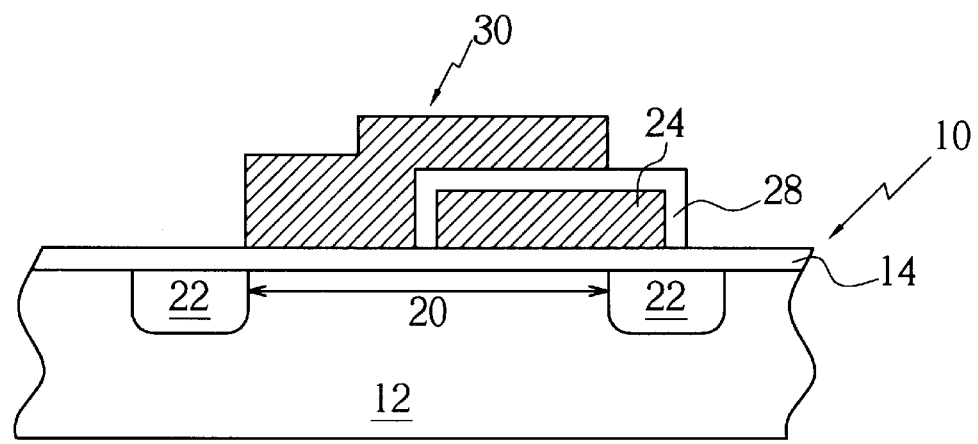
Figure 5:
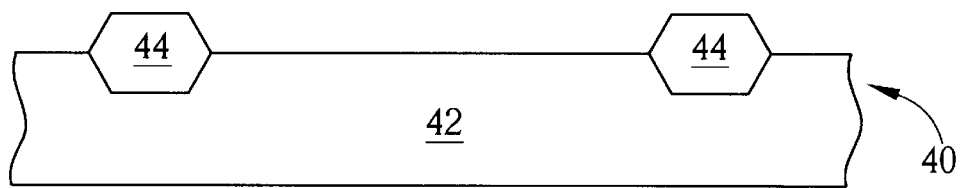
FIG. 5 to FIG. 10 are schematic diagrams of a method of fabricating a split-gate flash memory cell according to the present invention.

Please refer to FIG. 5 to FIG. 10 of schematic diagrams of a method of fabricating a split-gate flash memory cell on a semiconductor wafer 40 according to the present invention. As shown in FIG. 5, the semiconductor wafer 40 includes a silicon substrate 42, and a plurality of field oxide (FOX) layers 44 positioned on the silicon substrate 42. The field oxide layers 44 are used to define a plurality of active areas on the silicon substrate 42, and they can also be replaced by shallow trench isolation (STI) structures. In a better embodiment of the present invention, the silicon substrate 42 is a P-type single crystal silicon substrate with a surface of (100) crystallographic plane.

Figure 6:
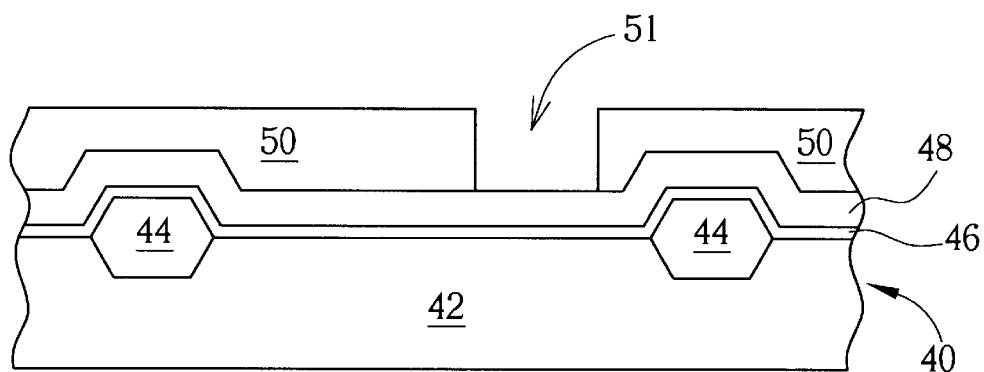

As shown in FIG. 6, a thermal oxidation method is used to form a silicon oxide layer 46 with a thickness of approximately 100 to 200 Å on the surface of the semiconductor wafer 40. Following this, an LPCVD is performed to form a silicon nitride layer 48 with a thickness of approximately 2000 Å on surfaces of the silicon oxide layer 46 and the field oxide layers 44. Then, a photoresist layer 50 is formed on the silicon nitride layer 48 followed by performing a photolithographic process to form an opening 51 in the photoresist layer 50. The opening 51 defines the position for forming a V-shape structure.

Figure 7:
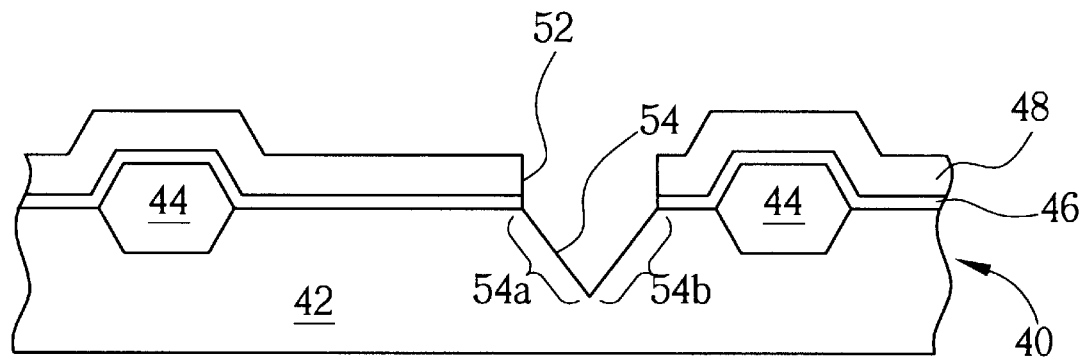

As shown in FIG. 7, using the photoresist layer 50 as a hard mask, an etching process is performed to remove a portion of the silicon nitride layer 48 and a portion of the silicon oxide layer 46, down to the surface of the silicon substrate 42, forming an opening 52 penetrating through the silicon nitride layer 48 and the silicon oxide layer 46. Sequentially, along the opening 52, a portion of the silicon substrate 42 is etched and a V-shape structure 54 is formed under the opening 52 in the remaining silicon substrate 42. According to a best embodiment of the present invention, the silicon substrate 42 is a cubic crystal structure and a wet etching is suggested to etch the silicon substrate 42. The wet etching uses potassium hydroxide (KOH) as an etching solution. An etching selectivity of potassium hydroxide between the (100) plane and the (111) plane of the silicon substrate 42 is approximately 100:1. Following the wet etching, the V-shape structure 54 is thus formed in the silicon substrate 42 with two intersecting sides 54a and 54b consisting of (111) planes. An angle between the two sides 54a and 54b of the V-shape structure 54 is about 70.4 degrees.

Figure 8:
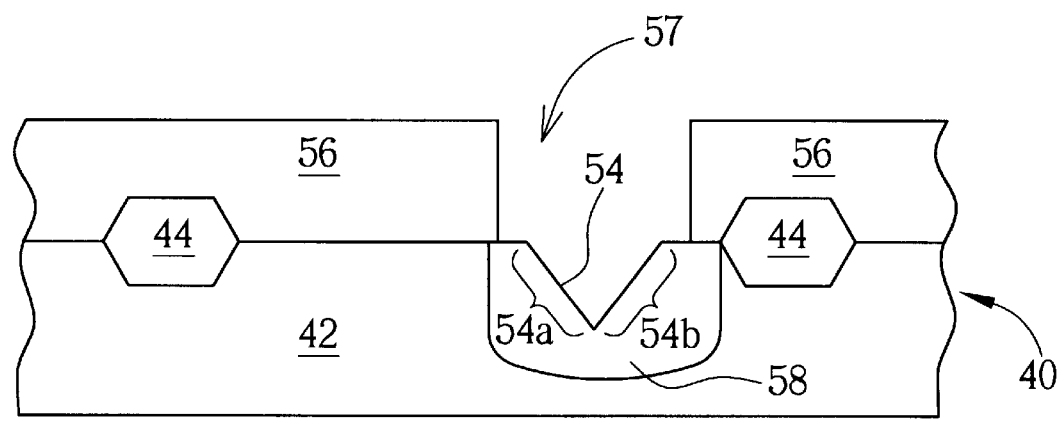

As shown in FIG. 8, after the V-shape structure 54 is formed, the silicon nitride layer 48 and the silicon oxide layer 46 are completely removed. Then, a photolithographic process is performed to form a photoresist layer 56 on the semiconductor wafer 40 and form an opening 57 in the photoresist layer 56. The opening 57 defines a position for forming a doping region. Subsequently, using the photoresist layer 56 as a hard mask, an ion implantation process is performed to implant N-type dopants into the silicon substrate 42, forming a doping region 58 around the V-shape structure 54. The doping region 58, functioning as a drain of the split-gate flash memory cell, is positioned adjacent to a vertical side of one of the field oxide layers 44. Thereafter, the photoresist layer 56 is completely stripped. In a preferred embodiment of the present invention, the ion implantation process mentioned above may also utilize the silicon nitride layer 48 and the silicon oxide layer 46 for defining the position of the V-shape structure 54 as an implantation mask. The silicon nitride layer 48 and the silicon oxide layer 46 are removed after the doping region 58 is formed, thereby eliminating a photolithographic process and reducing the production cost.

Figure 9:
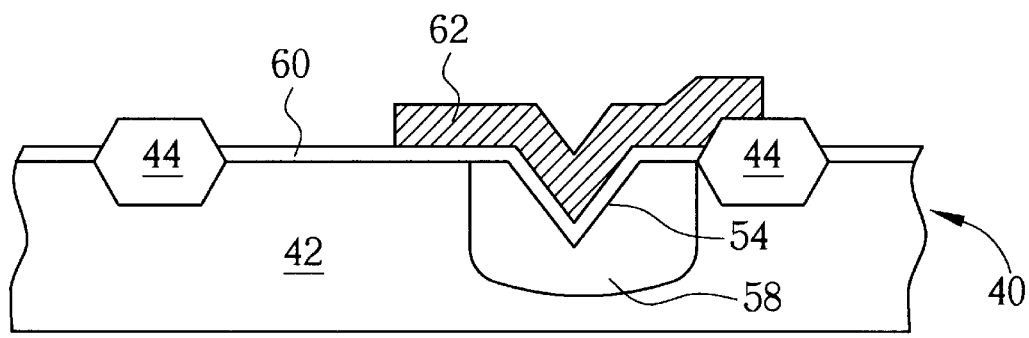

Thereafter, as shown in FIG. 9, a thermal oxidation is performed to form a silicon oxide layer as a tunneling oxide layer 60 on surfaces of the silicon substrate 42 and the V-shape structure 54. The tunneling oxide layer 60 grown on the (100) plane is approximately 150 Å thick, and the tunneling oxide layer 60 grown on the (111) plane is approximately 240 Å thick. In addition, during the thermal oxidation, the dopants in the doping region 58 may also be activated. Subsequently, an LPCVD is performed to form a polysilicon layer (not shown) on the surface of the tunneling oxide layer 60. Then, a photolithographic process and an etching process are performed to remove a portion of the polysilicon layer, thus forming a floating gate 62 of the split-gate flash memory cell above the doping region 58. Therein, a vertical side of the floating gate 62 is positioned atop one of the field oxide layers 44 that is adjacent to the doping region 58.

Figure 10:
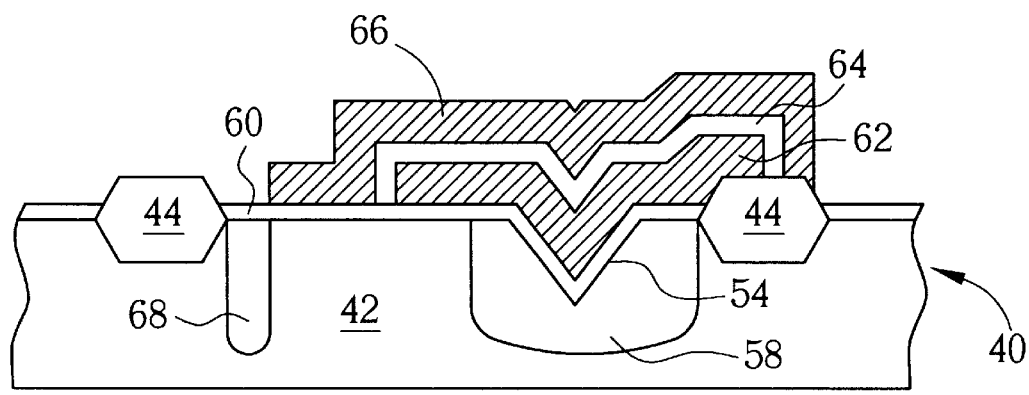

As shown in FIG. 10, a thermal oxidation is used to form an ONO dielectric layer 64 on the floating gate 62. The ONO dielectric layer 64 consists of a oxide layer of 50 Å thick, a silicon nitride layer of 100 Å thick and a silicon oxide layer of 50 Å thick. Then, a polysilicon controlling gate 66 is formed on the ONO dielectric layer 64. Taking the controlling gate 66 as a hard mask, an ion implantation process is thereafter performed to implant N-type dopants into a portion of the silicon substrate 42 adjacent to the controlling gate 66 to form a doping region 68. The doping region 68 is a source of the split-gate flash memory cell. Finally, a rapid thermal processing is used to activate the dopants in the doping region 68 and complete the fabrication of the split-gate flash memory cell of the present invention.

For forming the V-shape structure 54 in the silicon substrate 42, the preferred embodiment of the present invention utilizes the etching selectivity of the etching solution between different crystallographic planes to define the profile of the V-shape structure 54. Following that, the floating gate 62 and the controlling gate 66 are formed, respectively, above the V-shape structure 54. As a result, point discharge is utilized through the V-shape structure 54 to facilitate removal of the electrons storing in the floating gate 62 in an erasing operation of the split-gate flash memory cell. The erasing voltage required by the floating gate 62 and the controlling gate 66 is thus lowered to a reasonable value.

In contrast to the prior art of fabricating the flash memory cell, the V-shape structure is positioned under the floating gate according to the present invention. Thus, while using the Fowler Nordheim tunneling technique to erase, point discharge is utilized through the V-shape structure to facilitate removal of the electrons storing in the floating gate. As a result, methods to form a high electric field in the prior art, such as supplying a high voltage on the controlling gate or decreasing the thickness of the tunneling oxide layer, are not required. Since the erasing voltage needed by the flash memory cell is directly lowered and the tunneling oxide layer remains a sufficient thickness in the present invention, and so the quality of the flash memory cell is effectively improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of fabricating a flash memory cell to that utilizes point discharge to reduce the an operation voltage of erasing, the method comprising:

providing a semiconductor substrate;

performing an etching process to remove portions of the semiconductor substrate to form at least one V-shape structure in the semiconductor substrate;

performing a first ion implantation process to form a first doping region around the V-shape structure;

forming a first dielectric layer on the surfaces of the semiconductor substrate and the first doping region;

forming a floating gate on the first dielectric layer over the first doping region;

forming a second dielectric layer on the floating gate;

forming a controlling gate on the second dielectric layer, a side of the controlling gate being positioned on the semiconductor substrate adjacent to the floating gate; and performing a second ion implantation process ustilizing the controlling gate as a mask to form at least one a second doping region in the semiconductor substrate.

2. The method of claim 1 wherein the V-shape structure is used to perform point discharge during an erasing operation of the flash memory cell, so as to and reduce the operation voltage of erasing of the flash memory cell.

3. The method of claim 1 wherein the etching process is a wet etching process using potassium hydroxide (KOH) as an etching solution.

4. The method of claim 1 wherein the V-shape structure is formed on two intersecting (111) planes in the semiconductor substrate.

5. The method of claim 1 wherein an angle between two sides of the V-shape structure is about 70.4 degrees.

6. The method of claim 1 wherein the semiconductor substrate comprises a P-type silicon substrate.

7. The method of claim 1 wherein the second dielectric layer comprises an oxide/nitride/oxide (ONO) layer.

8. A method of fabricating a split-gate flash memory cell on a semiconductor substrate, the semiconductor substrate comprising a (100) surface and at least two (111) planes, a silicon oxide layer being positioned on the semiconductor substrate, the method comprising:

performing a photolithographic and etching processes to form an opening in the silicon oxide layer, the opening connecting to the surface of the semiconductor substrate;

performing an etching process along the opening, the etching process having a predetermined etching selectivity of the (100) surface to the (111) planes and forming a V-shape structure in the semiconductor substrate;

forming a first doping region in the semiconductor substrate to surround the V-shape structure;

forming a first dielectric layer on the semiconductor substrate, followed by forming a floating gate on the first dielectric layer over the first doping region;

forming a second dielectric layer on the floating gate;

forming a controlling gate on the second dielectric layer and on the semiconductor substrate adjacent to the floating gate; and forming a second doping region in the semiconductor substrate adjacent to the controlling gate to complete the fabrication of the split-gate flash memory cell.

9. The method of claim 8 wherein the method further comprises a field oxide layer (FOX) process to form a plurality of fileld oxide layers on the semiconductor substrate, and to define positions of a plurality of active areas.

10. The method of claim 9 wherein the first doping region is positioned adjacent to one of the field oxide layers such that a portion of the floating gate is positioned atop the filed oxide layer.

11. The method of claim 8 wherein either side of the V-shape structure is formed on one of the (111) planes.

12. The method of claim 8 wherein the etching process is a wet etching process using potassium hydroxide (KOH) as an etching solution.

13. The method of claim 8 wherein the predetermined etching selectivity approximately equals 100.

14. The method of claim 8 wherein an angle between two sides of the V-shape structure is about 70.4 degrees.

15. The method of claim 8 wherein the V-shape structure is used to perform point discharge during an erasing operation of the split-gate flash memory cell, so as to and reduces the operation voltage of erasing of the split-gate flash memory cell.

16. The method of claim 8 wherein the semiconductor substrate comprises a P-type silicon substrate.

17. The method of claim 8 wherein the second dielectric layer comprises an oxide/nitride/oxide (ONO) layer.

* * * * *